United States Patent [19]

Hwang et al.

[11] Patent Number: 6,003,753
[45] Date of Patent: Dec. 21, 1999

[54] AIR-BLOW SOLDER BALL LOADING SYSTEM FOR MICRO BALL GRID ARRAYS

[75] Inventors: Simon Hwang; Hae Sung Chung, both of Seoul, Rep. of Korea

[73] Assignee: Motorola, Inc., Schaubmburg, Ill.

[21] Appl. No.: 08/891,963

[22] Filed: Jul. 14, 1997

[51] Int. Cl.[6] .............................. B23K 1/00; B23K 35/12; B65H 3/60; B23Q 7/04
[52] U.S. Cl. .............................. 228/41; 228/33; 228/246; 221/200; 221/211
[58] Field of Search ................................ 228/41, 253, 245, 228/246, 6.2, 180.21, 180.22, 49.5; 221/200, 211

[56] References Cited

U.S. PATENT DOCUMENTS

| | | | |
|---|---|---|---|
| 5,279,045 | 1/1994 | Odashima et al. | 34/10 |
| 5,445,313 | 8/1995 | Boyd et al. | 228/248.1 |
| 5,467,913 | 11/1995 | Namekawa et al. | 228/41 |
| 5,601,229 | 2/1997 | Nakazato et al. | 228/246 |

*Primary Examiner*—Patrick Ryan
*Assistant Examiner*—Kiley Stoner
*Attorney, Agent, or Firm*—Anthony M. Martinez

[57] ABSTRACT

In a ball grid array (BGA) station (50) having a robotic arm (60) with a vacuum head (70) containing a predetermined quantity of vacuum apertures (90), a method and apparatus of loading an array of solder balls (14) for solder bumping a carrier (20). Solder balls (14) are supplied into a tub (500) having a head opening (510) for accommodating a vacuum head (70). After the vacuum head (70) is positioned by the robotic arm (60) towards the head opening (510) of the tub (500), suitable fluid pressure (570) is applied to the solder balls (14) within the tub (500) to force the solder balls (14) to float on the gas pressure towards the vacuum apertures (90). The vacuum apertures (90), which are appropriately sized and annularly shaped has at least a partial vacuum (34) applied through the apertures (90) to suck-up a desired quantity of solder balls for eventual placement on the BGA carrier (20).

17 Claims, 5 Drawing Sheets

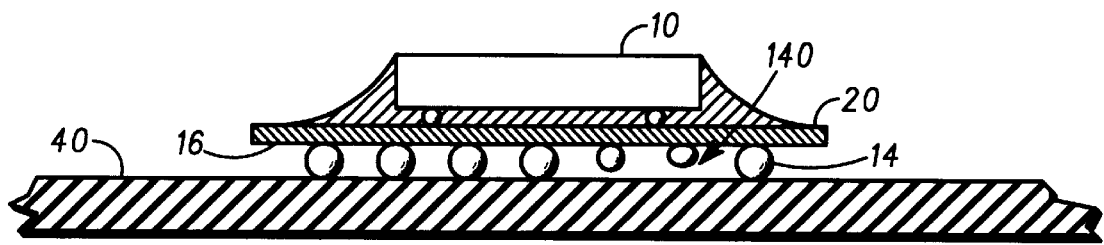
FIG.1
— PRIOR ART —
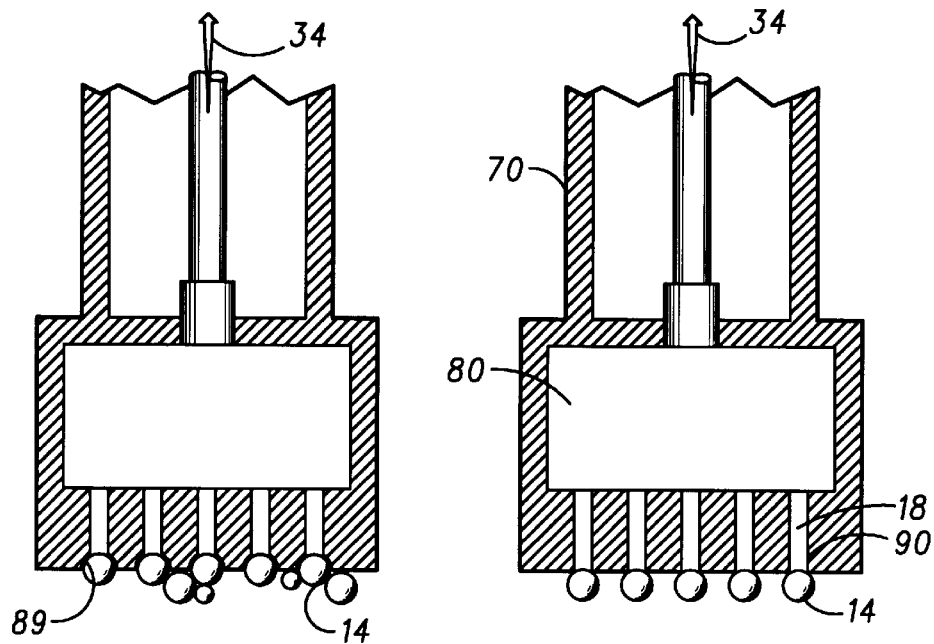
FIG.2
— PRIOR ART —
FIG.4
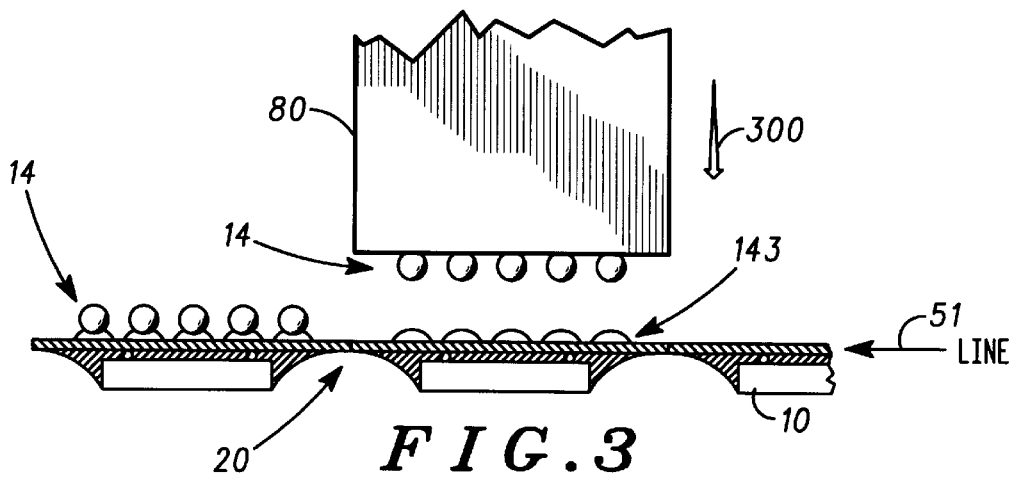
FIG.3

AIR-BLOW SOLDER BALL LOADING SYSTEM FOR MICRO BALL GRID ARRAYS

TECHNICAL FIELD

This invention relates generally to loading methods and more particularly to a method of loading solder balls to a ball grid array (BGA) robotic arm.

BACKGROUND

Ball grid array packages (BGA's) are known in the electronics industry to provide the attachment of a high density of input and output (I/O) solder pads on a chip carrier where a chip is already mounted on a carrier. BGA is a type of Chip Scale Package structure which uses a solder ball attach process on the bottom side of the carrier to mount the chip carrier onto a substrate. The substrate could be a printed circuit board or another type of mother boards.

Bumping these BGA carriers to form the solder pads for eventual connection with the substrate requires accurate and co-planar attachment of hundreds, and often thousands of solder spheres or balls per array on the carder. For mass production, the co-planarity quality of solder balls on the carrier after the ball attach process is an important concern of the quality process. A uniform height distribution of solder balls for a co-planar attachment is necessary to provide good electrical and mechanical connections between the carrier and the substrate.

Referring to FIG. 1, one source of the non-planarity 140 problem of a ball grid array (BGA) Chip Scale package is represented where the solder balls are not uniform in height and therefore may not make good connections when they are sandwiched between a substrate 40 and the carrier 20. Hence, to optimize the co-planarity of the solder ball placement process, pre-formed solder balls are necessary. Even though pre-formed solder balls may cost more than other processes, such as screen printing with a solder paste, pre-formed solder balls which provides a constant solder ball height are preferred when co-planarity cannot otherwise be achieved.

A semiconductor device 10, such as an integrated (IC) chip, is shown mounted on a carrier 20 as a chip carrier for eventual mounting to a substrate 40. An example of a substrate 40 is a printed circuit (PC) board, a multi-chip module, or a mother board. A plurality of hemispherical cavities or flat contact pads on top of the substrate are normally arranged in a square or other geometric pattern suitable to receive the corresponding BGA solder-bumped chip carrier 20, or the like. Each of the cavities or contact pads is metalized so as to become solderable and electrically conductive to provide the electrical interconnection between the chip carrier 20 and the substrate 40. The solder-bumped chip carrier (or other member) 20 includes a plurality of BGA solder bumps 14 formed on the underside, or the bottom surface 16, of the carrier 20.

A robot is commonly used for precise solder ball placement of the pre-formed solder balls. Often, an all-in-one robot station handles the fluxing duties as well as the co-planar placement of the balls. A highly accurate robot arm equipped with a precision tooled vacuum head picks, fluxes, and places these tiny balls. The robot arm employed is often vision equipped such as the Seiko XM robot arm. Vision inspection of the solder ball loading and unloading for carrier placement avoids or traps obvious solder ball placement carrier rejects. A complete system called the MMS SA-150 BGA Sphere Attach System is available from the Motorola Manufacturing Systems of Motorola.

A robotic arm in a conventional solder ball loading system has a vacuum head with a vacuum tool tip called an end-effector. As seen in FIG. 2, a cross-section of a conventional vacuum tool tip of the vacuum head is represented. The vacuum tool tip end-effector is lowered to simultaneously pick-up all the pre-formed balls from a bulk bin containing thousands of solder spheres. However, picking the balls out of the bin with the vacuum head is not simple because the supply level of the balls is constantly changing and the balls can easily clump together at one of the vacuum head openings. Moreover, the downward force of the vacuum head can easily damage some of the solder balls contained in the bin and also jam one or more balls into the head openings.

The conventional vacuum hole is spherical and has a diameter that is larger than the spherical solder ball to enable the spherical periphery of the vacuum head opening to grip around the solder ball. However, as the BGA ball size decreases to micro sizes, such as around a diameter of 12 mils (0.305 mm), with the advance of microelectronics, the resulting smaller spherical portion of the vacuum hole becomes more difficult to make uniform.

Furthermore, as smaller solder balls decrease in size, they also increase their sensitivity to static electricity and decrease their sensitivity to gravity. These difficulties of handling 0.305 mm pre-formed solder balls result in an increasing amount of ball clusters occurring around the vacuum holes. Prior-art loading systems have thus used a vibrating or a heating device, such as a shaking-type container, to help remove these unwanted clusters of excess solder balls but still is barely effective for the gravity-resistant 0.305 mm solder balls. The success rate of picking-up a preformed 0.305 mm solder ball undamaged for making a proper connection in a conventional shaking-type container is nearly zero.

This inability to provide a clusterless and damage-proof solder ball loading process has frustrated attempts to provide BGA mounting techniques that are reliable in a mass production environment utilizing minimum in-line automation equipment, repeatable automatic process control, and high through-put productions of chip carriers on substrates such as printed circuit (PC) boards, multi-chip modules, or mother-boards. Accordingly, a need exists in the art to provide a solder ball loading system in a manner that provides co-planarity and consistency in solder ball attachment while avoiding the difficulties presented by prior hard-to-manufacture vacuum spherical holes and eliminating the extra cost and necessity of a cluster removal device at the robotic arm station.

BRIEF DESCRIPTION OF THE DRAWINGS

FIG. 1 is a cross-sectional view of a BGA chip carrier and substrate package with non-planar solder bumps.

FIG. 2 is a cross-section of a conventional vacuum tool tip of the vacuum head.

FIG. 3 is a cross-sectional view of a BGA solder bumping process of a carrier, in accordance with the present invention.

FIG. 4 is a cross-section of a vacuum tool tip end of the vacuum head, in accordance with the present invention.

DETAILED DESCRIPTION OF THE PREFERRED EMBODIMENT

Figure 5:
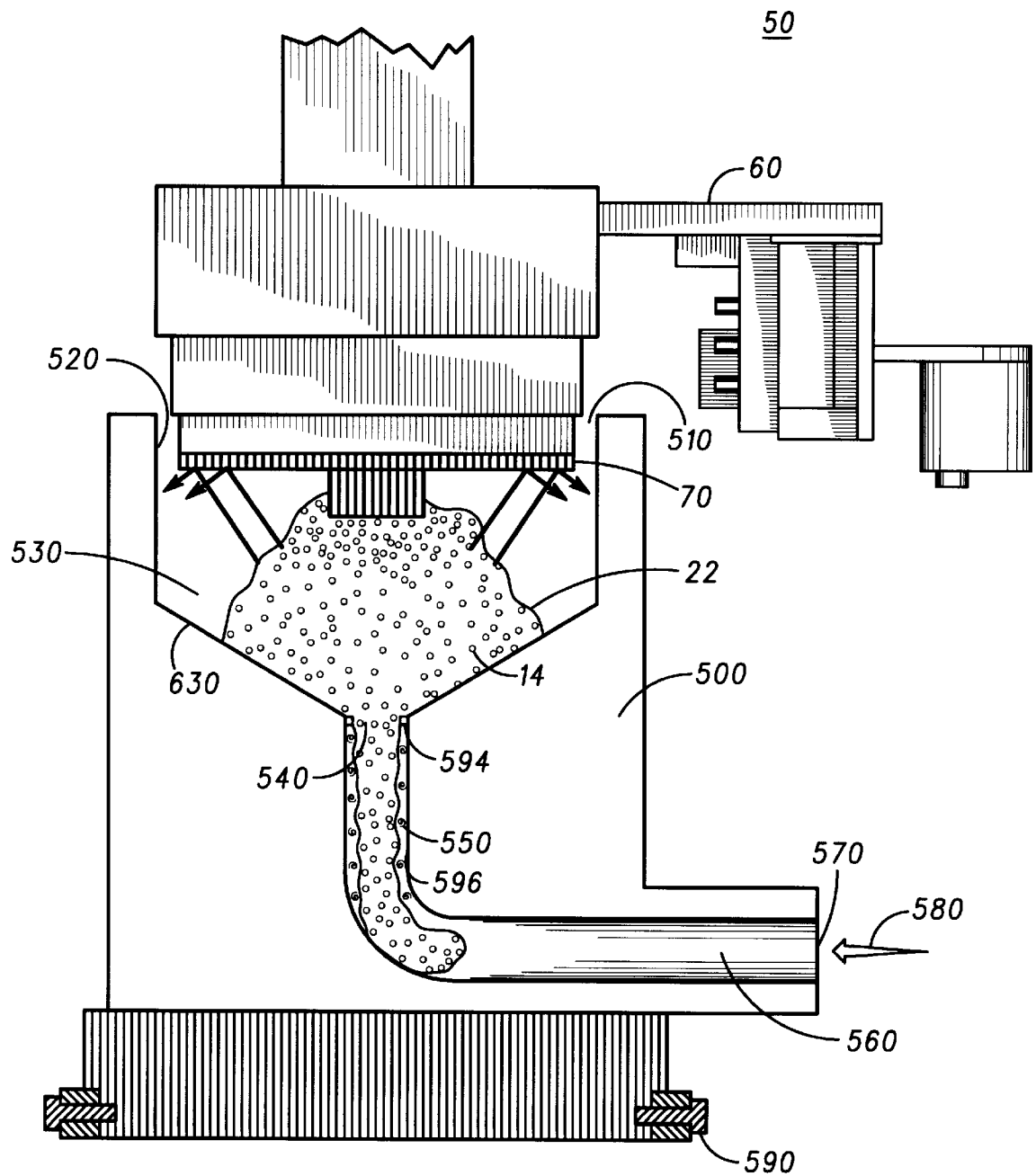
FIG. 5 is a cross-sectional view of a BGA carrier solder loading station, in accordance with the present invention.

Referring to FIGS. 3–8, a solder ball attach station 50 in a BGA manufacturing line 51 for the accurate placement of solder balls or spheres 14 on the ball grid array (BGA) carrier or package 20 of FIG. 3 employs a robotic arm 60 having a vacuum head 70 of FIG. 5. The vacuum head has a tool end or end-effector 80 that includes a plurality of vacuum ducts 18 ending with openings, holes, or other apertures 90 that are magnified in FIG. 4. A predetermined number of apertures 90 correspond to the number of carrier solder bumps needed. These apertures or holes, for simpler illustration purposes, are arranged in a square or other geometric pattern corresponding to a pre-fluxed contact pad pattern 143 of the substrate in FIG. 3.

As seen in FIG. 4, each aperture has a circular or annular and preferably flat periphery around it, as part of the duct, for contacting with and picking up a disposed solder ball for subsequent ball placement on the pre-fluxed substrate. According to the teachings of the present invention, the prior spherical vacuum openings of FIG. 2 are substituted with a suitable elongation of the circular vacuum channel or duct to end the duct with a circular hole or periphery to only slightly pick-up the solder ball without causing ball damage. Vacuum holes are more easily made more accurate and uniform by cutting the ducts off flat rather than forming the prior spherical ends 89 of FIG. 2. To accommodate picking up a micro solder ball having a diameter of around 0.3 mm, the diameter of each of the vacuum apertures of FIG. 4 preferably ranges from around 0.203 mm to 0.254 mm. In general, for any sized solder ball or sphere, the diameter of each of the vacuum apertures preferably ranges from around 60% to 90% of the diameter of the preformed solder ball.

After the vacuum ducts' apertures 90 pick or suck up the solder balls, the robotic arm with the solder ball filled vacuum hole tool head 80 moves downward 300 to a carrier 20 and places the solder balls 14 onto the carrier 20 of FIG. 3.

The manufacturing line 51 uses a pallet or bare board to hold and transport (on rollers) the carrier 20 having contact pads that are previously fluxed 143. The pallet enters the station and is located and aligned by the identification of fiducials. Once the solder balls are placed on the carrier 20, the pallet transports the BGA solder bumped carrier 20 on rollers towards the next station. In order to form a metallic bond between the solder ball and the base metal of the substrate, a solder reflow station is the next station entered by the pallet after the solder ball attach process is completed. Afterwards, other stations are sequenced such as a marking & singulation station to separate out each individual device.

The station further includes a bulk dispenser or bin of preformed solder balls (not shown). A pneumatic or alternatively a hydraulic lift can be used to lift the bin to dispense the solder balls from the bin into a tub and subsequently return the dispenser to its original position. Once the pallet is lifted and located, or otherwise aligned, the bin or dispenser bulk pours the solder balls into a tub 500 of FIG. 5.

The tub 500 for carrying pre-formed solder spheres 14 for loading an array of solder balls for solder bumping on the BGA carrier 20 of FIG. 3 is represented generally as a funnel having a stem that has an elbow turn for receiving a gas flow in FIG. 5. However, other shapes for the tub is possible and envisioned by the teachings of the present invention.

Preferably, a rectangular box-like chamber having four rectangular side walls 520 provide a first port, or head opening 510, for accommodating the shape of the vacuum head 70 when the head is lowered sufficiently or otherwise positioned substantially near the top (510) of the four rectangular side walls 520. Continuing as the mouth of the funnel, a pyramid-like chamber 530 having a second port 540 and four triangular side walls 630 form the cone of the funnel. The triangular side walls 630 converge from the rectangular box-like chamber 520 towards the second port 540. The second port 540 is preferably circular to accommodate the vertical pipe base 550 of the funnel. Hence, a vertical funnel portion of the tub is formed where the top of the funnel is formed by the rectangular box-like chamber and the pyramid-like chamber, the second port is sized smaller than and concentric with the first port.

Finally, to form the bent portion of the elbow stem of the funnel, a horizontal pipe 560 is connected to the vertical pipe 550 preferably at a right angle. The horizontal pipe 560 includes a blower port inlet 570 for receiving an inflow of gas pressure 580 and for channeling the gas pressure to the second port 540 of the funnel. To protect the solder balls 14 from electro-static discharge, the tub is preferably grounded 590 and made of metal or of an anti-static material, such as anti-static acryl.

Figure 7:
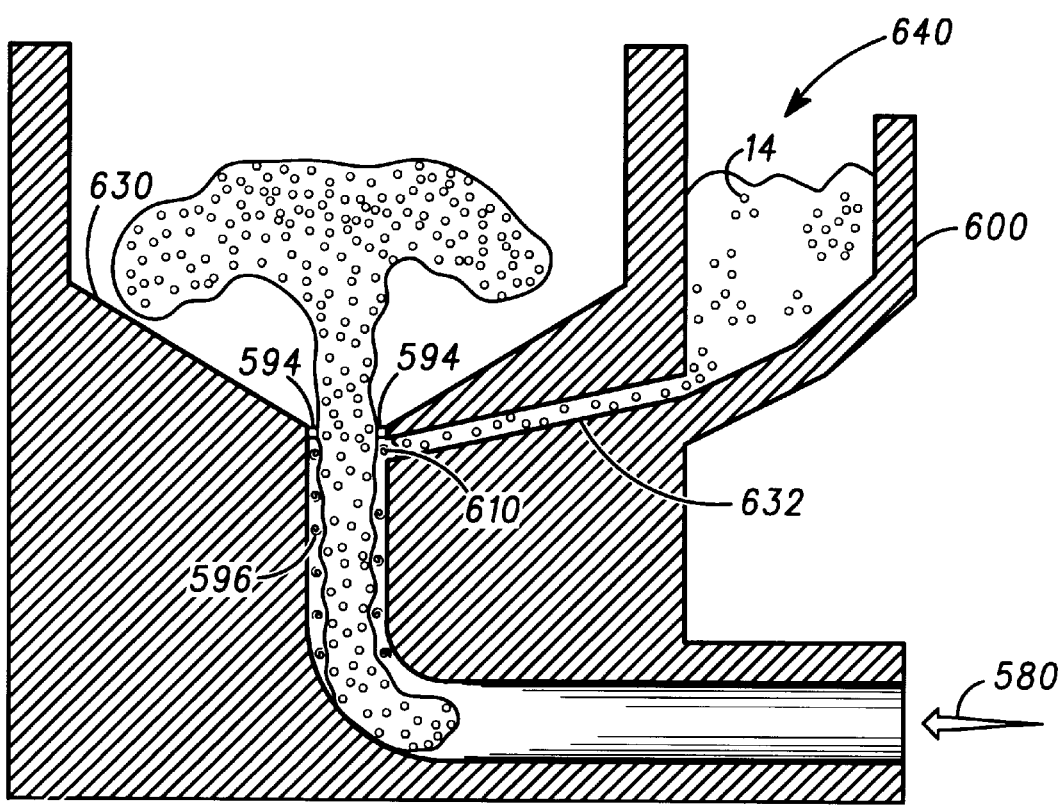
FIG. 7 is a simplified cross-sectional view of a tub and chute attachment, in accordance with the present invention.

Optionally, the tub further includes an annular ring 594 mounted or otherwise disposed on the vertical pipe 550 below the second port 540 and above a third port of the tub 500 as seen in FIG. 7. The slight protrusion of the ring 594 partially partitions the pipe from the pyramid-like chamber 530 to obstruct, constrict, and otherwise inhibit spinning gas currents 596 of FIG. 5 seen along the vertical pipe portion 550 from interfering with the desired solder ball flow towards the vacuum tool head 80.

Figure 6:
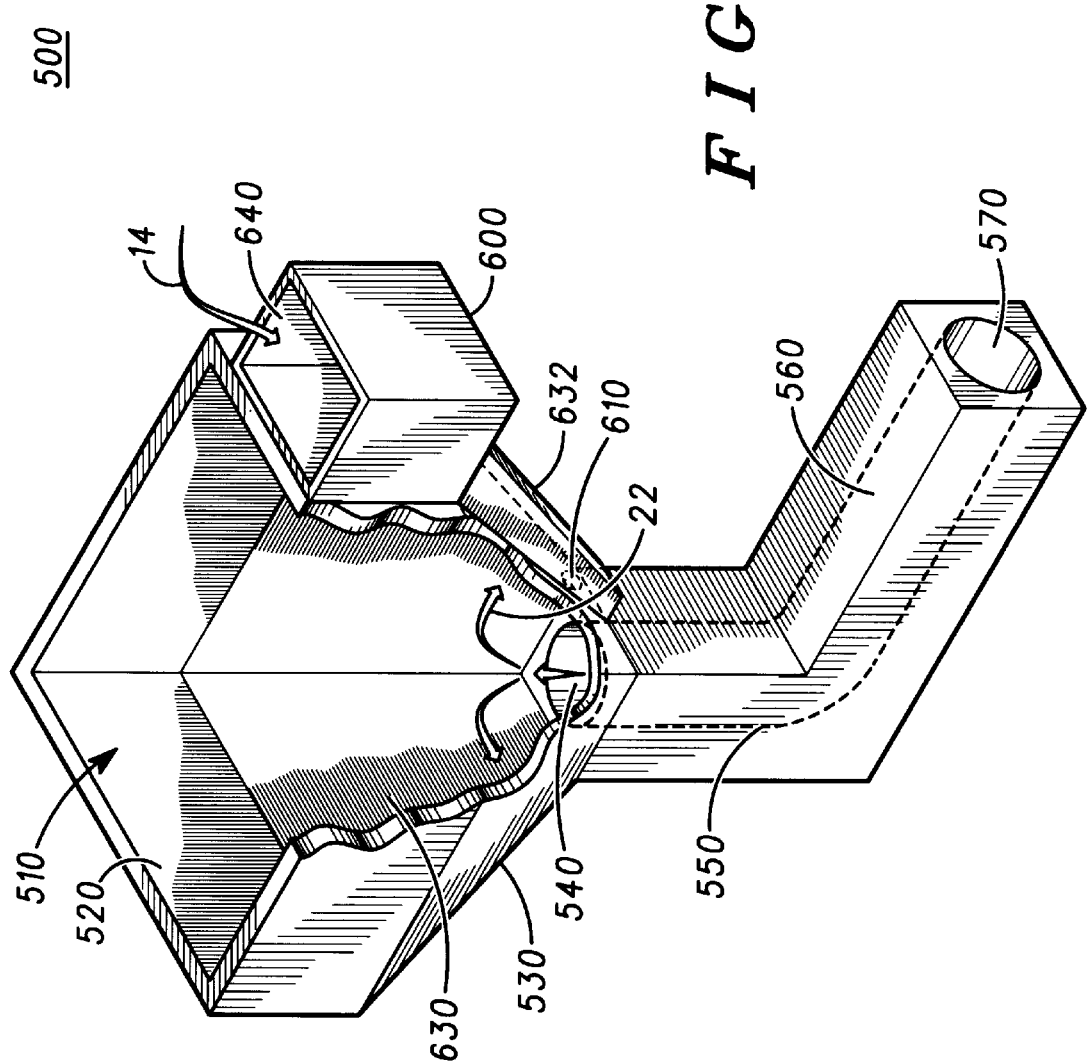
FIG. 6 is a perspective representation of a tub and chute attachment, in accordance with the present invention.

As easier seen in FIGS. 6 and 7, the station includes an optional chute attachment 600 that can be coupled to the third port, otherwise termed a ball supply entry port or chute opening 610 for dispensing the pre-formed solder balls 14 into the tub 500. The third port or chute opening 610 can be of any shape but preferably circular for receiving a smooth supply of pre-formed solder balls 14 into the tub 500 and is optionally placed below and perpendicular to the second port 540 separated by the annular ring 594. Even though the chute attachment 600 is represented as a side reservoir with a slide 632 and a top opening 640 for dumping in balls, any ball entry system with a constant supply from the bin for continuously urging and supplying the solder balls into the tub can be used.

Figure 8:
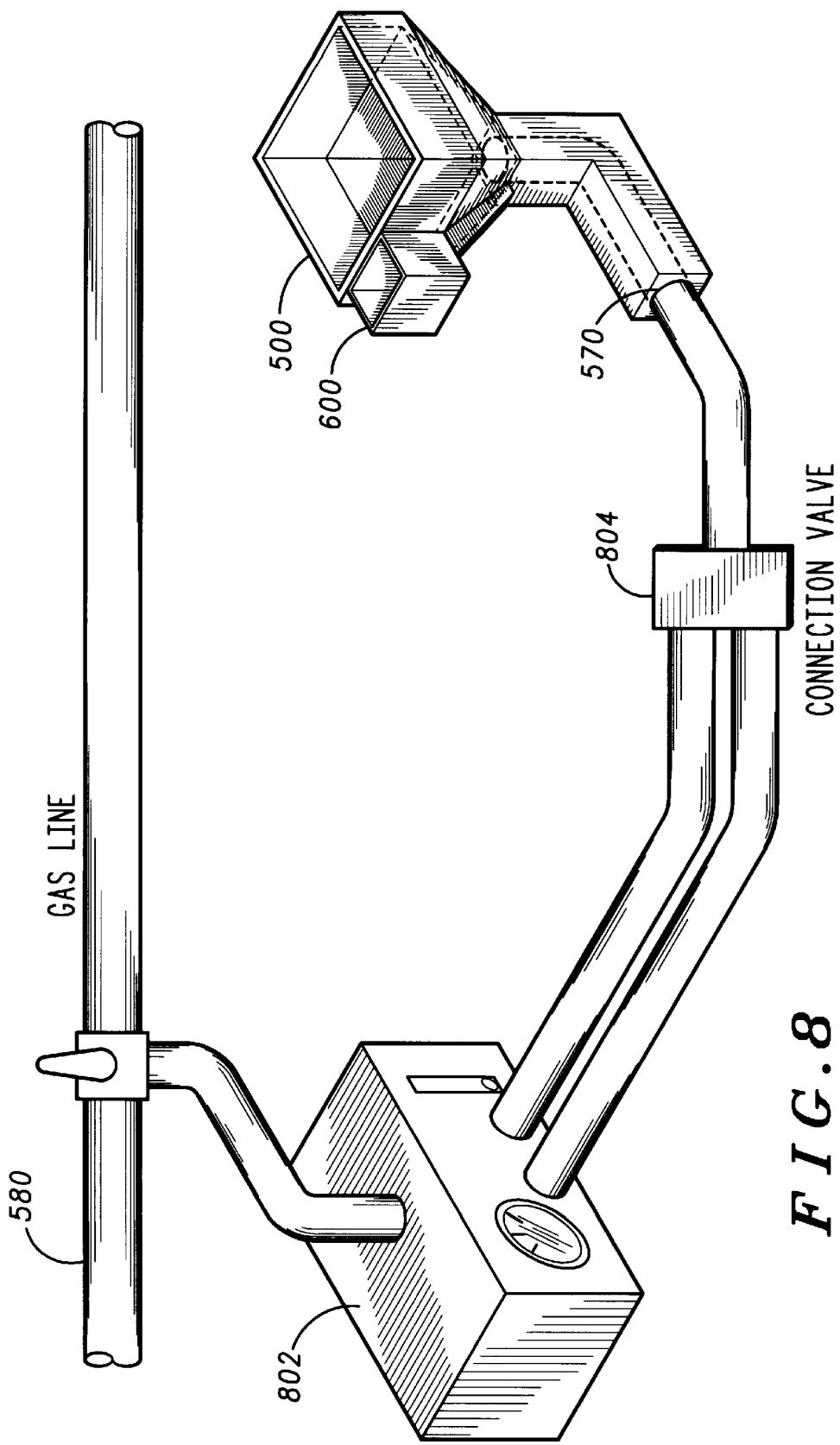
FIG. 8 is a simplified representation of a gas blower system, in accordance with the present invention.

A gas blow entry system of FIG. 8 allows a directed flow of gas 580 to move the solder balls towards the vacuum head 70 of FIG. 5. This same directed flow of gas 580 also provides sufficient agitation to blow-off or otherwise remove the extra solder balls attached to the vacuum head or that are attached to each other because static electricity. The appropriate gas pressure and gas flow is turned ON and applied for several seconds to urge or otherwise direct the solder balls towards the center of the vacuum head, near the tool end 80. The application of vacuum is not applied at this point.

According to the teachings of the present invention as seen in FIG. 5, a continuous gas-blown feed of a plurality of solder balls 22 is dispensed all around the periphery (all four sides or other shapes as the BGA package solder pattern dictates) of the vacuum head tool end 80 as blown by an applied fluid pressure. The optimized gas or fluid pressure is generated by a gas applied whose flow is controlled by an electrical gas controller 802 of FIG. 8 to create the suitable pressure.

Gas 580 is allowed into the tub 500 and eventually into the vacuum chamber provided by the duct 18 of the vacuum head opening 90 of FIG. 4. The gas is applied at a controlled rate for a continuous flow as provided by a control valve 804 and the electrical gas controller 802 of FIG. 8. The fluid or atmospheric pressure of the gas forces the solder balls 14 into the general direction and area of the vacuum head holes 90 of FIG. 4. Controlled by the gas controller 802, the solder balls cover the general area substantially near all of the holes of the vacuum head after the gas is appropriately applied.

Preferably, as suitably controlled by the gas controller 802, gas is continuously blown into the tub 500. Before the vacuum head 70 is slightly lowered or otherwise positioned to cover the top or head opening 510 of the tub, the gas is simply adapted for a soft blow such that the solder balls can freely float within the tub, horizontally or otherwise, unclustered in the horizontal pipe portion 560 of FIG. 5. However, after the vacuum head has been lowered, the gas is rectified to a constant predetermined gas pressure such that the gas will cause the solder balls to fly to a required constant height towards the vacuum apertures 90 of FIG. 4. The vertically square or rectangular chamber portion 520 of the tub serves to corral the solder balls within the corresponding square or rectangular confines of the bottom surface of the vacuum head 70 of FIG. 5.

After the solder ball flow or cloud 22 of FIG. 5 approaches the apertures 90, vacuum 34 of FIG. 4 is continuously applied as controlled by a vacuum valve. Entrapped gas that was in the duct 18 between the solder ball and the vacuum head hole 90, is evacuated to suck or otherwise hold the solder ball 14 by the periphery of the vacuum head hole 90. Each of the solder ball's larger diameter and spherical surface rolls and centers into a corresponding hole opening 90 to fill the ducts 18. Due to the agitation provided by the gas pressure, any unsucked solder balls 14 will bounce off the vacuum head 70 or side-walls 520 and 630 of the tub to fall back into the horizontal portion of the tub 500 of FIG. 5. With the above steps, in accordance with the invention, the total solder ball load time may be efficiently reduced. At this point after loading, the gas flow is reverted back to the soft-blow. Hence, fluid pressure plays an important role of removing the extra pre-formed solder balls attached to the vacuum head or to each other through static-electricity, as well as supplying a sufficient amount of solder balls to the vacuum head.

To prevent oxidation of the preformed solder balls, the gas which is preferably an anti-oxidant, such as nitrogen ($N_2$) is preferably used. However, in a mass-production environment where the pre-formed solder balls are consumed within the two or three day period before the oxidation process starts, dry air can be used instead of the nitrogen gas.

In summary, vacuum and gas pressure are applied to load a BGA solder ball robotic vacuum head. This process starts with the continuous dispensing of a plurality of solder balls into a tub. Fluid pressure, as provided by a gas controlled by a gas controller, is applied to the plurality of solder balls to force at least a portion of the solder balls into the direction of the vacuum head. Controlled by a gas controller, the balls are softly blown or floated towards the vacuum head hole. As the solder balls approach the holes, they are "sucked into" the duct by capillary action of the vacuum head. The duration of vacuum flow incurs in a relatively short cycle time of minutes. At least a partial vacuum is applied to the vacuum head hole and the nearest solder ball to substantially evacuate the area between the vacuum head hole and the solder ball. Additionally, the sequential application of gas pressure and vacuum also lends itself to in-line automation, repeatable automatic process control, and high through-put production of chip carriers on any suitable substrate.

We claim:

1. A station in a manufacturing line for loading solder balls on a ball grid array carrier, the station comprising:
    a robotic arm having a vacuum head that includes vacuum apertures for applying at least a partial vacuum through the vacuum apertures to pick-up the solder balls; and
    a tub having a funnel portion and a channel portion,
    wherein the funnel portion includes a first port and a second port concentric with the first port,
    wherein the first port is shaped to accommodate the shape of the vacuum head, and
    wherein the channel portion includes a third port perpendicular to the second port for channeling a fluid pressure to the second port of the funnel portion.

2. The station of claim 1, wherein the vacuum apertures are annular in shape.

3. The station of claim 2, wherein the diameter of each of the vacuum apertures ranges from around 60% to 90% of the diameter of the solder balls.

4. The station of claim 2, wherein the diameter of each of the vacuum apertures ranges from around 0.203 mm to 0.254 mm for picking up a solder ball having a diameter of around 0.3 mm.

5. The station of claim 1, wherein the fluid pressure is generated by Nitrogen gas.

6. The station of claim 1, wherein the fluid pressure is controlled by a gas controller.

7. The station of claim 1, wherein the fluid pressure is generated by dry air.

8. A station in a manufacturing line for loading an array of solder balls for the accurate placement of solder balls on a ball arid array carrier, the station comprising:
    a tub having a head opening, a chute, and a blower port inlet;
    a dispenser for supplying a plurality of solder balls into the chute of the tub;
    a robotic arm having a vacuum tool for positioning the vacuum tool towards the head opening of the tub;
    a blower disposed at the blower port inlet of the tub for applying fluid pressure towards the plurality of solder balls to force at least a portion of the plurality of solder balls to float towards the vacuum tool; and
    a vacuum head located in the vacuum tool, the vacuum head having a predetermined quantity of vacuum apertures for applying at least a partial vacuum through the predetermined quantity of vacuum adertures to pick-up a same predetermined quantity of the plurality of solder balls blown by the blower,
    wherein the tub comprises,
        a funnel portion having a first port and a second port, the second port sized smaller than and concentric with the first port, the first port shaped to accommodate the shape of the vacuum head and forming the head opening; and
        a channel portion having a third port sized smaller than and perpendicular to the second port for receiving the plurality of solder balls supplied through the chute, the channel portion for receiving the blower at the blower port and for channeling the fluid pressure to the second port of the funnel portion.

9. The station of claim 8, wherein the funnel portion and channel portion comprise:
    a rectangular box-like chamber having four rectangular side walls to provide the first port;

a pyramid-like chamber having four triangular side walls converging from the rectangular box-like chamber towards the second port, the second port being circular in shape; and a pipe perpendicularly bent with a curved radius in the shape of an elbow, the circular pipe having a vertically bent pipe portion forming a base for the funnel portion and for connecting to the second port and a horizontally bent pipe portion for forming the channel portion and the blower port inlet.

10. The station of claim 9 further comprising:

an annular ring disposed on the vertically bent pipe portion below the second port and above the third port for partially partitioning the pipe from the pyramid-like chamber.

11. The station of claim 9 further comprising:

an annular ring disposed on the vertically bent pipe portion below the second port and above the third port for partially partitioning the pipe from the pyramid-like chamber to inhibit spinning gas currents along the vertical walls of the vertically bent pipe portion from interfering with the smooth floating of the plurality of solder balls towards the vacuum tool.

12. The station of claim 1 wherein the tub is made of metal.

13. The station of claim 1 wherein the tub is made of anti-static acryl.

14. The station of claim 1, further comprising:

a dispenser for supplying the solder balls into the channel portion; and a blower coupled to the third port for applying the fluid pressure to force at least a portion of the solder balls to float towards the vacuum head.

15. A station in a manufacturing line for loading solder balls on a ball grid array carrier, the station comprising:

a robotic arm having a vacuum head that includes vacuum apertures for applying at least a partial vacuum through the vacuum apertures to pick-up the solder balls; and a tub, wherein the tub comprises, a rectangular box-like chamber having four rectangular side walls to provide a first port for accommodating the shape of the vacuum head substantially near the top of the four rectangular side walls;

a pyramid-like chamber having a second port and four triangular side walls converging from the rectangular box-like chamber towards the second port, the second port being circular in shape;

a vertical pipe portion coupled to the second port for forming a base for a funnel portion, wherein the top of the funnel is formed by the rectangular box-like chamber and the pyramid-like chamber, the second port is sized smaller than and concentric with the first port; and a horizontal pipe portion connected to the vertical pipe portion, the horizontal pipe portion having a blower port inlet for receiving an inflow of gas pressure and for channeling the gas pressure to the second port of the funnel.

16. The station of claim 15, wherein the vertical pipe portion includes a third port or receiving the solder balls into the tub.

17. The station of claim 15, wherein the tub further comprises an annular ring disposed on the vertical portion below the second port for partially partitioning the pipe from the pyramid-like chamber.

* * * * *

UNITED STATES PATENT AND TRADEMARK OFFICE
CERTIFICATE OF CORRECTION

PATENT NO. : 6,003,753
DATED : December 21, 1999
INVENTOR(S) : Simon Hwang, Hae Sung Chung It is certified that error appears in the above-identified patent and that said Letters Patent is hereby corrected as shown below:

Column 6, claim 8,
Line 48, delete "adertures" and replace with -- apertures --.

Signed and Sealed this

Twelfth Day of March, 2002

Attest:

JAMES E. ROGAN
Director of the United States Patent and Trademark Office

Attesting Officer